(12) United States Patent
Li et al.

(10) Patent No.: US 12,720,946 B2
(45) Date of Patent: Aug. 25, 2026

(54) ORGANIC LIGHT-EMITTING DIODE, DISPLAY PANEL AND DISPLAY DEVICE

(71) Applicants: Hefei BOE Joint Technology Co., Ltd., Hefei (CN); BOE Technology Group Co., Ltd., Beijing (CN)

(72) Inventors: Xinyu Li, Beijing (CN); Xinxin Wang, Beijing (CN); Xiang Wan, Beijing (CN); Cheng Xu, Beijing (CN); Dandan Zhou, Beijing (CN); Ningning Wang, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 386 days.

(21) Appl. No.: 18/577,723

(22) PCT Filed: Mar. 16, 2023

(86) PCT No.: PCT/CN2023/081791

§ 371 (c)(1),
(2) Date: Jan. 9, 2024

(87) PCT Pub. No.: WO2024/187441

PCT Pub. Date: Sep. 19, 2024

(65) Prior Publication Data

US 2025/0126965 A1 Apr. 17, 2025

(51) Int. Cl.
*H10K 50/13* (2023.01)
*H10K 102/00* (2023.01)

(52) U.S. Cl.
CPC ....... *H10K 50/13* (2023.02); *H10K 2102/351* (2023.02)

(58) Field of Classification Search
None
See application file for complete search history.

(56) References Cited

U.S. PATENT DOCUMENTS

| | | | | |
|---|---|---|---|---|
| 2018/0062103 | A1 | 3/2018 | Kim et al. | |
| 2018/0308905 | A1 | 10/2018 | Jia et al. | |
| 2020/0144548 | A1 | 5/2020 | Xia et al. | |
| 2024/0188318 | A1 | 6/2024 | Zhang et al. | |
| 2024/0206218 | A1 | 6/2024 | Jia | |
| 2025/0126965 | A1 * | 4/2025 | Li | H10K 50/80 |

FOREIGN PATENT DOCUMENTS

| | | | |
|---|---|---|---|
| CN | 104393180 | A | 3/2015 |
| CN | 106898704 | A | 6/2017 |
| CN | 107833975 | A | 3/2018 |
| CN | 110164911 | A | 8/2019 |
| CN | 112599689 | A | 4/2021 |
| CN | 113097399 | A | 7/2021 |
| CN | 114203922 | A | 3/2022 |
| WO | 2022/056792 | A1 | 3/2022 |
| WO | 2022/110113 | A1 | 6/2022 |

* cited by examiner

*Primary Examiner* — Jack S Chen
(74) *Attorney, Agent, or Firm* — XSENSUS LLP

(57) ABSTRACT

Provided is an organic light-emitting diode, wherein the organic light-emitting diode includes: a first electrode, at least two emission layers, an optical modulation layer and a second electrode which are sequentially laminated on a base substrate; wherein a color of a mixture of light emitted from the at least two emission layers is white; and a thickness of the optical modulation layer ranges from 5 nm to 100 nm.

20 Claims, 7 Drawing Sheets

01
second electrode
104
optical modulation layer
103
at least two emission layers
102
first electrode
101
1
base substrate
2

| film layer | thickness range (nm) |
|---|---|
| second electrode (cathode IZO) | 80-120 |
| first charge generation layer (n-CGL) | 50-200 |
| optical modulation layer (p-CGL) | |
| second hole block layer (HBL) | 5-20 |
| third emission layer (B-EML) | 10-30 |
| second electron block layer (EBL) | 10-30 |
| third hole transport layer (HTL) | 10-30 |
| fourth charge generation layer (CGL) | 10-30 |
| electron transport layer (ETL) | 5-20 |
| second emission layer (Y-EML) | 30-60 |
| fourth emission layer (R-EML) | 5-20 |
| second hole transport layer (HTL) | 5-20 |
| third charge generation layer (CGL) | 5-20 |
| first hole block layer (HBL) | 5-20 |
| first emission layer (B-EML) | 10-40 |
| first electron block layer (EBL) | 5-20 |
| first hole transport layer (HTL) | 100-130 |
| hole injection layer (p-HIL) | 5-20 |
| first electrode (anode ITO) | 5-20 |
| reflective layer | 50-150 |

FIG. 5

| film layer | thickness range (nm) |
|---|---|
| second electrode (cathode IZO) | 80-120 |
| first charge generation layer (n-CGL) | 50-200 |
| optical modulation layer (p-CGL) | |
| second hole block layer (HBL) | 5-20 |
| third emission layer (B-EML) | 10-30 |
| second electron block layer (EBL) | 10-30 |
| third hole transport layer (HTL) | 10-30 |
| fourth charge generation layer (CGL) | 10-30 |
| electron transport layer (ETL) | 5-20 |
| second emission layer (Y-EML) | 30-60 |
| fourth emission layer (R-EML) | 5-20 |
| second hole transport layer (HTL) | 5-20 |
| third charge generation layer (CGL) | 5-20 |
| first hole block layer (HBL) | 5-20 |
| first emission layer (B-EML) | 10-40 |
| first electron block layer (EBL) | 5-10 |
| first hole transport layer (HTL) | 5-50 |
| hole injection layer (p-HIL) | 5-10 |
| first electrode (anode ITO) | 5-10 |
| reflective layer | 50-150 |

FIG. 6

| film layer | thickness range (nm) |
|---|---|
| second electrode (cathode IZO) | 80-120 |
| optical modulation layer (HATCN) | 20-100 |
| first charge generation layer (n-CGL) | 80-100 |
| second hole block layer (HBL) | 5-20 |
| third emission layer (B-EML) | 10-30 |
| second electron block layer (EBL) | 10-30 |
| third hole transport layer (HTL) | 10-30 |
| fourth charge generation layer (CGL) | 10-30 |
| electron transport layer (ETL) | 5-20 |
| second emission layer (Y-EML) | 30-60 |
| fourth emission layer (R-EML) | 5-20 |
| second hole transport layer (HTL) | 5-20 |
| third charge generation layer (CGL) | 5-20 |
| first hole block layer (HBL) | 5-20 |
| first emission layer (B-EML) | 10-40 |
| first electron block layer (EBL) | 5-20 |
| first hole transport layer (HTL) | 100-130 |
| hole injection layer (p-HIL) | 5-20 |
| first electrode (anode ITO) | 5-20 |
| reflective layer | 50-150 |

FIG. 7

| film layer | thickness range (nm) |
|---|---|
| second electrode (cathode IZO) | 80-120 |
| optical modulation layer (HATCN) | 20-100 |
| first charge generation layer (n-CGL) | 80-100 |
| second hole block layer (HBL) | 5-20 |
| third emission layer (B-EML) | 10-30 |
| second electron block layer (EBL) | 10-30 |
| third hole transport layer (HTL) | 10-30 |
| fourth charge generation layer (CGL) | 10-30 |
| electron transport layer (ETL) | 5-20 |
| second emission layer (Y-EML) | 30-60 |
| fourth emission layer (R-EML) | 5-20 |
| second hole transport layer (HTL) | 5-20 |
| third charge generation layer (CGL) | 5-20 |
| first hole block layer (HBL) | 5-20 |
| first emission layer (B-EML) | 10-40 |
| first electron block layer (EBL) | 5-10 |
| first hole transport layer (HTL) | 5-50 |
| hole injection layer (p-HIL) | 5-10 |
| first electrode (anode ITO) | 5-10 |
| reflective layer | 50-150 |

FIG. 8

| film layer | thickness range (nm) |
|---|---|
| second electrode (cathode IZO) | 80-120 |
| first charge generation layer (n-CGL) | 10-110 |
| optical modulation layer (HATCN) | 10-20 |
| second charge generation layer (n-CGL) | 30-70 |
| second hole block layer (HBL) | 5-20 |
| third emission layer (B-EML) | 10-30 |
| second electron block layer (EBL) | 10-30 |
| third hole transport layer (HTL) | 10-30 |
| fourth charge generation layer (CGL) | 10-30 |
| electron transport layer (ETL) | 5-20 |
| second emission layer (Y-EML) | 30-60 |
| fourth emission layer (R-EML) | 5-20 |
| second hole transport layer (HTL) | 5-20 |
| third charge generation layer (CGL) | 5-20 |
| first hole block layer (HBL) | 5-20 |
| first emission layer (B-EML) | 10-40 |
| first electron block layer (EBL) | 5-20 |
| first hole transport layer (HTL) | 100-130 |
| hole injection layer (p-HIL) | 5-20 |
| first electrode (anode ITO) | 5-20 |
| reflective layer | 50-150 |

FIG. 9

| film layer | thickness range (nm) |
|---|---|
| second electrode (cathode IZO) | 80-120 |
| first charge generation layer (n-CGL) | 10-110 |
| optical modulation layer (HATCN) | 10-20 |
| second charge generation layer (n-CGL) | 30-70 |
| second hole block layer (HBL) | 5-20 |
| third emission layer (B-EML) | 10-30 |
| second electron block layer (EBL) | 10-30 |
| third hole transport layer (HTL) | 10-30 |
| fourth charge generation layer (CGL) | 10-30 |
| electron transport layer (ETL) | 5-20 |
| second emission layer (Y-EML) | 30-60 |
| fourth emission layer (R-EML) | 5-20 |
| second hole transport layer (HTL) | 5-20 |
| third charge generation layer (CGL) | 5-20 |
| first hole block layer (HBL) | 5-20 |
| first emission layer (B-EML) | 10-40 |
| first electron block layer (EBL) | 5-10 |
| first hole transport layer (HTL) | 5-50 |
| hole injection layer (p-HIL) | 5-10 |
| first electrode (anode ITO) | 5-10 |
| reflective layer | 50-150 |

FIG. 10

ORGANIC LIGHT-EMITTING DIODE, DISPLAY PANEL AND DISPLAY DEVICE

CROSS-REFERENCE TO RELATED APPLICATION

The present disclosure is a U.S. national stage of international application No. PCT/CN2023/081791, filed on Mar. 16, 2023, the content of which is herein incorporated by reference in its entirety.

TECHNICAL FIELD

The present disclosure relates to the field of display technologies, and in particular, to an organic light-emitting diode, a display panel and a display device.

BACKGROUND

Organic light-emitting diodes (OLEDs) are widely used in display panels because of their advantages such as self-illuminance, wide viewing angle, high contrast, fast response and flexible display.

SUMMARY

The present disclosure provides an organic light-emitting diode, a display panel and a display device. The technical solutions are as follows.

According to some embodiments of the present disclosure, an organic light-emitting diode is provided. The organic light-emitting diode includes: a first electrode, at least two emission layers, an optical modulation layer and a second electrode which are sequentially laminated on a base substrate; wherein a color of a mixture of light emitted from the at least two emission layers is white; and a thickness of the optical modulation layer ranges from 5 nm to 100 nm.

In some embodiments, the organic light-emitting diode further includes: a first charge generation layer disposed between the optical modulation layer and the second electrode; wherein a thickness of the first charge generation layer is greater than the thickness of the optical modulation layer.

In some embodiments, a ratio of the thickness of the first charge generation layer to the thickness of the optical modulation layer is 8:1.

In some embodiments, a total thickness of the first charge generation layer and the optical modulation layer ranges from 50 nm to 200 nm.

In some embodiments, the first charge generation layer includes a first body and a first doping material, wherein the first body is an electron transport layer, and the first doping material includes lithium, or the first doping material includes hydroxyquinolinolato-lithium and ytterbium; and the optical modulation layer includes a second body and a second doping material, wherein the second body is a hole transport layer, and the second doping material includes 12-hexaazatriphenylene, or the second doping material includes molybdenum oxide.

In some embodiments, a doping ratio of the first doping material in the first body ranges from 1.5% to 10%; and a doping ratio of the second doping material in the second body ranges from 5% to 20%.

In some embodiments, the organic light-emitting diode further includes: a first charge generation layer disposed between the at least two emission layers and the optical modulation layer; wherein a thickness of the first charge generation layer ranges from 80 nm to 100 nm.

In some embodiments, a material of the optical modulation layer is 12-hexaazatriphenylene.

In some embodiments, the organic light-emitting diode further includes: a first charge generation layer disposed between the optical modulation layer and the second electrode, and a second charge generation layer disposed between the optical modulation layer and the at least two emission layers; wherein a thickness of the first charge generation layer ranges from 10 nm to 110 nm, and a thickness of the second charge generation layer ranges from 30 nm to 70 nm.

In some embodiments, the first charge generation layer includes a first body and a first doping material, wherein the first body is an electron transport layer, and the first doping material includes lithium, or the first doping material includes hydroxyquinolinolato-lithium and ytterbium; and a material of the second charge generation layer is the same as a material of the first charge generation layer.

In some embodiments, a material of the optical modulation layer is different from the material of the first charge generation layer, and the thickness of the optical modulation layer is less than the thickness of the second charge generation layer.

In some embodiments, the material of the optical modulation layer is 12-hexaazatriphenylene.

In some embodiments, the thickness of the optical modulation layer ranges from 10 nm to 20 nm.

In some embodiments, the at least two emission layers include: a first emission layer, a second emission layer and a third emission layer which are sequentially laminated in a direction going away from the base substrate; wherein a color of light emitted from the first emission layer is the same as a color of light emitted from the third emission layer, and a color of light emitted from the second emission layer is different from the color of the light emitted from the first emission layer.

In some embodiments, the organic light-emitting diode further includes: a reflective layer disposed on a side of the first electrode close to the base substrate, and a hole injection layer, a first hole transport layer and a first electron block layer which are disposed between the first electrode and the first emission layer and are sequentially laminated in the direction going away from the base substrate; wherein a thickness of the reflective layer ranges from 50 nm to 150 nm, a thickness of the first electrode ranges from 5 nm to 20 nm, a thickness of the hole injection layer ranges from 5 nm to 20 nm, a thickness of the first hole transport layer ranges from 100 nm to 130 nm, and a thickness of the first electron block layer ranges from 5 nm to 20 nm; or a thickness of the reflective layer ranges from 50 nm to 150 nm, a thickness of the first electrode ranges from 5 nm to 10 nm, a thickness of the hole injection layer ranges from 5 nm to 10 nm, a thickness of the first hole transport layer ranges from 5 nm to 50 nm, and a thickness of the first electron block layer ranges from 5 nm to 10 nm.

In some embodiments, the organic light-emitting diode further includes: a first hole block layer, a third charge generation layer and a second hole transport layer which are disposed between the first emission layer and the second emission layer and are sequentially laminated in the direction going away from the base substrate, wherein a thickness of the first hole block layer ranges from 5 nm to 20 nm, a thickness of the third charge generation layer ranges from 5 nm to 20 nm, and a thickness of the second hole transport layer ranges from 5 nm to 20 nm;

the organic light-emitting diode further includes: an electron transport layer, a fourth charge generation layer, a third hole transport layer and a second electron block layer which are disposed between the second emission layer and the third emission layer and are sequentially laminated in the direction going away from the base substrate, wherein a thickness of the electron transport layer ranges from 5 nm to 20 nm, a thickness of the fourth charge generation layer ranges from 10 nm to 30 nm, a thickness of the third hole transport layer ranges from 10 nm to 30 nm, and a thickness of the second electron block layer ranges from 10 nm to 30 nm.

In some embodiments, the at least two emission layers further include: a fourth emission layer disposed between the first emission layer and the second emission layer; wherein a color of light emitted from the fourth emission layer is different from the color of the light emitted from the first emission layer, and is different from the color of the light emitted from the second emission layer.

In some embodiments, a thickness of the first emission layer ranges from 10 nm to 40 nm, a thickness of the second emission layer ranges from 30 nm to 60 nm, a thickness of the third emission layer ranges from 10 nm to 30 nm, and a thickness of the second electrode ranges from 80 nm to 120 nm.

According to some embodiments of the present disclosure, a display panel is provided. The display panel includes: a base substrate, and a plurality of organic light-emitting diodes as described in the above aspect, wherein the plurality of organic light-emitting diodes are disposed on a side of the base substrate.

According to some embodiments of the present disclosure, a display device is provided. The display device includes: a power supply assembly, and the display panel as described in the above aspect; wherein the power supply assembly is configured to supply power to the display panel.

BRIEF DESCRIPTION OF DRAWINGS

For a clearer description of the technical solutions in the embodiments of the present disclosure, the following briefly introduces the accompanying drawings required for describing the embodiments. The accompanying drawings in the following descriptions show merely some embodiments of the present disclosure, and persons of ordinary skill in the art may still derive other drawings from these accompanying drawings without creative effort.

FIG. 5 is a schematic diagram of thicknesses of film layers of an organic light-emitting diode according to some embodiments of the present disclosure;

FIG. 6 is a schematic diagram of thicknesses of film layers of another organic light-emitting diode according to some embodiments of the present disclosure;

FIG. 7 is a schematic diagram of thicknesses of film layers of still another organic light-emitting diode according to some embodiments of the present disclosure;

FIG. 8 is a schematic diagram of thicknesses of film layers of still another organic light-emitting diode according to some embodiments of the present disclosure;

FIG. 9 is a schematic diagram of thicknesses of film layers of still another organic light-emitting diode according to some embodiments of the present disclosure;

FIG. 10 is a schematic diagram of thicknesses of film layers of still another organic light-emitting diode according to some embodiments of the present disclosure.

DETAILED DESCRIPTION

To make the objectives, technical solutions and advantages of the present disclosure clearer, the embodiments of the present disclosure will be further described in detail below with reference to the accompanying drawings.

In the related art, a display panel includes a plurality of organic light-emitting diodes, and the organic light-emitting diode includes an anode, a cathode, and an organic light-emitting film layer disposed between the anode and the cathode. The distance between the anode layer and the cathode layer (the thickness of the organic light-emitting film layer) is referred to as a microcavity length, and the microcavity length affects the optical performance of the organic light-emitting diode. Therefore, the design of the thickness of the organic light-emitting film layer has a big influence on the optical performance of the organic light-emitting diode.

However, in the related art, due to the thickness of the organic light-emitting film layer, it is difficult to achieve better optical performance of the organic light-emitting diode, resulting in a poor display effect of the display panel.

Figure 1:
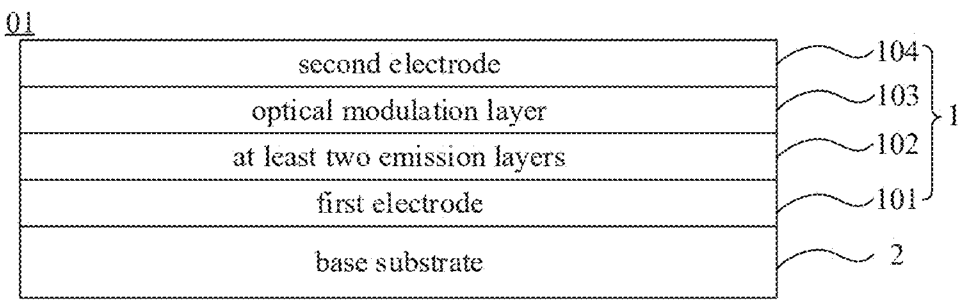
FIG. 1 is a schematic structural diagram of a display panel according to some embodiments of the present disclosure.

FIG. 1 is a schematic structural diagram of a display panel according to some embodiments of the present disclosure. Referring to FIG. 1, the organic light-emitting diode 1 in the display panel 01 includes a first electrode 101, at least two emission layers (EML) 102, an optical modulation layer 103, and a second electrode 104 which are sequentially laminated on a base substrate 2.

The color of a mixture of light emitted from the at least two emission layers 102 is white, that is, the organic light-emitting diode 1 is configured to emit white light.

In the embodiments of the present disclosure, the thickness of the optical modulation layer 103 ranges from 5 nm (nanometers) to 100 nm. Since the optical modulation layer 103 is provided in the organic light-emitting diode 1, and the thickness of the optical modulation layer 103 ranges from 5 nm to 100 nm, that is, the thickness the optical modulation layer 103 has a bigger modulation range, in the case that the thicknesses of other film layers between the first electrode 101 and the second electrode 104 vary, an optical modulation layer 103 having a different thickness can be provided to adjust the microcavity length of the organic light-emitting diode 1, thereby ensuring the optical performance of the organic light-emitting diode 1 and the display effect of the display panel 01.

In some embodiments, the first electrode 101 is an anode, and the second electrode 104 is a cathode. Under the driving of an applied driving voltage, electrons from the second electrode 104 and holes of the first electrode 101 move to the emission layers of the organic light-emitting diode 1. When the holes and electrons meet at the emission layers, energy excitons are generated to excite the light-emitting molecules to generate visible light.

In summary, the embodiments of the present disclosure provide an organic light-emitting diode. The organic light-emitting diode includes a first electrode, at least two emission layers, an optical modulation layer, and a second electrode. The thickness of the optical modulation layer has a relatively bigger range. Therefore, in the case that the thicknesses of other film layers between the first electrode and the second electrode vary, an optical modulation layer having a different thickness can be provided to adjust the microcavity length of the organic light-emitting diode, thereby ensuring the optical performance of the organic light-emitting diode and the display effect of the display panel.

In some embodiments, the material of the first electrode 101 is indium tin oxide (ITO), and the material of the second electrode 104 is indium zinc oxide (IZO). Indium zinc oxide is generally prepared by a sputtering process. The sputtering process is to bombard a target with particles and then form a film. When the particles are deposited, a certain amount of energy is generated, which damages the emission layers to some extent and has an effect on the injection of the electrons generated by the second electrode 104 into the emission layers.

In the embodiments of the present disclosure, since the optical modulation layer 103 is disposed between the at least two emission layers 102 and the second electrode 104, the optical modulation layer 103 can protect the at least two emission layers 102 (mainly protect the emission layer closest to the second electrode 104), to minimize the damage to the emission layers caused by the sputtering process for manufacturing the second electrode 104, thereby ensuring the injection of the electrons generated by the second electrode 104, preventing dark spots from generating in the display panel 01, and ensuring the display effect of the display panel 01.

Additionally, the material of the first electrode 101 is at least one of aluminum (Al), argentum (Ag), and molybdenum (Mo).

As an optional implementation, the organic light-emitting diode 1 further includes a first charge generation layer 105 disposed between the optical modulation layer 103 and the second electrode 104. That is, the first charge generation layer 105 is disposed on the side of the optical modulation layer 103 away from the base substrate 2.

The thickness of the first charge generation layer 105 is greater than the thickness of the optical modulation layer 103. For example, the ratio of the thickness of the first charge generation layer 105 to the thickness of the optical modulation layer 103 is 8:1. In some embodiments, the total thickness of the first charge generation layer 105 and the optical modulation layer 103 ranges from 50 nm to 200 nm.

In some embodiments, the first charge generation layer 105 includes a first body and a first doping material. The first body is an electron transport layer, and the first doping material includes lithium (Li), or the first doping material includes hydroxyquinolinolato-lithium (LiQ) and ytterbium (Yb). That is, the first charge generation layer 105 is a conventional electron transport layer doped with the first doping material. The first charge generation layer 105 is abbreviated as n-CGL.

The optical modulation layer 103 includes a second body and a second doping material. The second body is a hole transport layer, and the second doping material includes 12-hexaazatriphenylene (HATCN), or the second doping material includes molybdenum oxide ($MoO_3$). That is, the optical modulation layer 103 is a conventional hole transport layer doped with the second doping material. The optical modulation layer 103 is abbreviated as p-CGL.

In the embodiments of the present disclosure, the doping ratio of the first doping material in the first body ranges from 1.5% to 10%, and the doping ratio of the second doping material in the second body ranges from 5% to 20%. The doping ratio of the first doping material in the first body refers to the film thickness ratio of the first doping material to the first body, and the doping ratio of the second doping material in the second body refers to the film thickness ratio of the second doping material to the second body.

In some embodiments, the lowest unoccupied molecular orbital (LUMO) energy level of the first body ranges from −2.75 eV (electron volts) to −2.9 eV, the highest occupied molecular orbital (HOMO) energy level of the first body ranges from −6 eV to 6.2 eV, and the electron mobility is $10^{-3}$ $cm^2/V\cdot S$ (square centimeter/volt·s) to $10^{-2}$ $cm^2/V\cdot S$; the LUMO energy level of the second body ranges from 5 eV to 6 eV, the HOMO energy level of the second body ranges from 9 eV to 10 eV, and the electron mobility ranges from $10^{-2}$ $cm^2/V\cdot S$ to $10^{-1}$ $cm^2/V\cdot S$.

As can be seen from Table 1 below, compared with the organic light-emitting diode 1 which is not provided with the optical modulation layer 103, in the organic light-emitting diode 1 provided with the optical modulation layer 103, the voltage (V), light-emitting efficiency (C.E.(cd/A), luminous flux per unit area), color point (CIEx) and color point (CIEy) do not vary greatly, but the lifespan is longer. The color point (CIEx) and the color point (CIEy) are used to measure the spectrum and color gamut of the organic light-emitting diode 1.

TABLE

| Thickness ratio of n-CGL to p-CGL | Doping ratio | V | C.E. (cd/A) | Color Point (CIEx) | Color Point (CIEy) | Lifespan |
|---|---|---|---|---|---|---|
| n-CGL:p-CGL = 9:0 | 0% | 100% | 100% | 0.3 ± 0.015 | 0.3 ± 0.025 | 100% |
| n-CGL:p-CGL = 8:1 | 10% | 102% | 100% | 0.3 ± 0.015 | 0.3 ± 0.025 | 125% |
| | 20% | 101% | 100% | 0.3 ± 0.015 | 0.3 ± 0.025 | 118% |

In Table 1 above, the ratio of the thickness of the first charge generation layer (n-CGL) 105 to the thickness of the optical modulation layer (p-CGL) 103 is 9:0, which means that the organic light-emitting diode is not provided with the optical modulation layer. The doping ratio refers to the doping ratio of the second doping material in the second body, which refers to the film thickness ratio of the second doping material to the second body. The lifespan refers to the lifespan when the current density is 50 J and the light-emitting efficiency decreases to 95%, which is denoted as LT95@50 J.

It can also be seen from Table 1 above that the lifespan of the organic light-emitting diode 1 can be prolonged by setting the ratio of the thickness of the first charge generation layer 105 to the thickness of the optical modulation layer 103 to be 8:1 and setting the total thickness of the first charge generation layer 105 and the optical modulation layer 103 to range from 50 nm to 200 nm.

For example, in the case that the film thickness ratio of the second doping material to the second body is 10%, the lifespan is prolonged by 125%−100%=25%, compared with the solution in which the optical modulation layer 103 is not provided. In the case that the film thickness ratio of the second doping material to the second body is 20%, the lifespan is prolonged by 118%−100%=18%, compared with the solution in which the optical modulation layer 103 is not provided.

In this implementation, by providing the optical modulation layer 103 before the second electrode 104, the optical performance of the organic light-emitting diode 1 can be improved, and the emission layers under the second electrode 104 can be protected, thereby ensuring the injection effect of the electrons generated by the second electrode 104, preventing the dark spots from generating in the display panel 01, and ensuring the display effect of the display panel 01.

Figure 3:
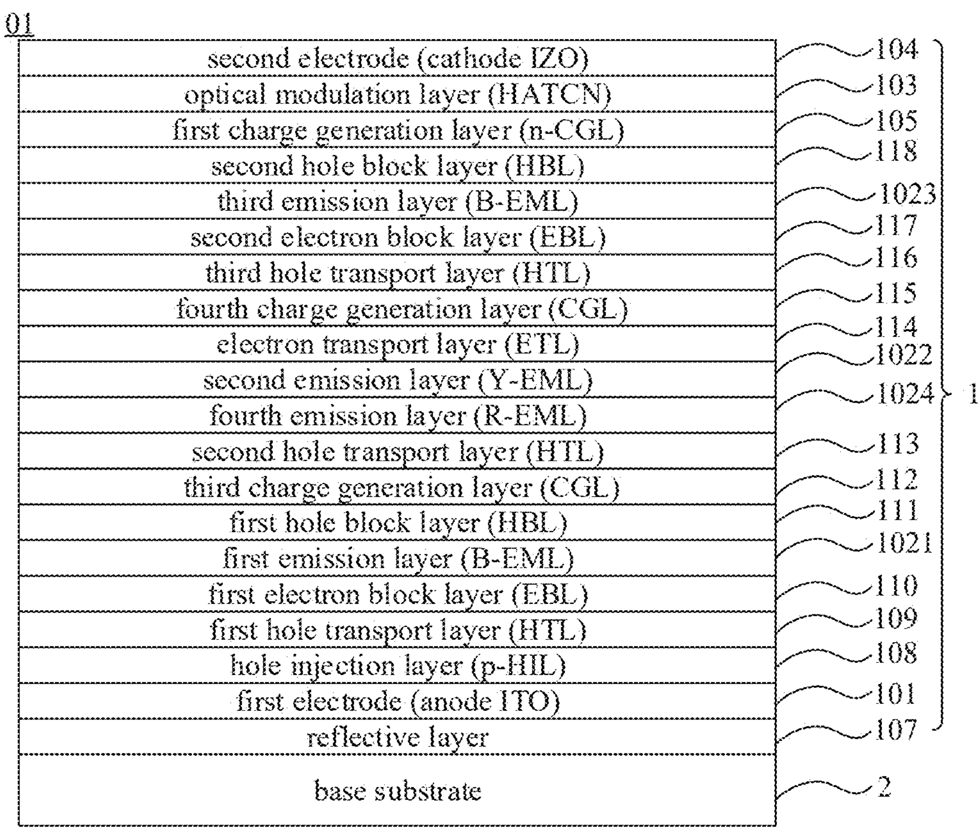
FIG. 3 is a schematic structural diagram of still another display panel according to some embodiments of the present disclosure.

As a second optional implementation, referring to FIG. 3, the organic light-emitting diode 1 further includes a first charge generation layer (CGL) 105 disposed between the at least two emission layers 102 and the optical modulation layer 103. That is, the first charge generation layer 105 is disposed on the side of the optical modulation layer 103 close to the base substrate 2.

The thickness of the first charge generation layer 105 ranges from 80 nm to 100 nm. The material of the optical modulation layer 103 is 12-hexaazatriphenylene (HATCN). The structure of HATCN is shown in formula (I) below.

(I)

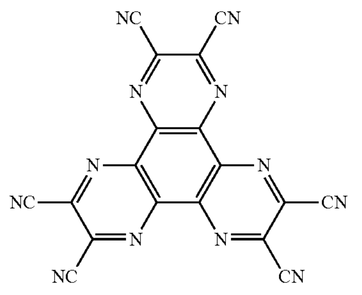

Additionally, the LUMO energy level of the optical modulation layer 103 is 5.7 eV, and the MOHO energy level of the optical modulation layer 103 is 9.5 eV.

As can be seen from Table 2 below, the voltage, spectrum, color gamut and lifespan of the organic light-emitting diode 1 provided with the optical modulation layer 103 are approximate to those of the organic light-emitting diode 1 which is not provided with the optical modulation layer 103, and the light-emitting efficiency is increased by 2%.

TABLE 2

| HATCN thickness (nm) | V | C.E. (cd/A) | Color point (CIEx) | Color point (CIEy) | Lifespan |
|---|---|---|---|---|---|
| 0 | 100% | 100% | 0.3 ± 0.003 | 0.3 ± 0.02 | 100% |
| 20 | 108% | 102% | 0.3 ± 0.003 | 0.3 ± 0.02 | 100% |

TABLE 2-continued

| HATCN thickness (nm) | V | C.E. (cd/A) | Color point (CIEx) | Color point (CIEy) | Lifespan |
|---|---|---|---|---|---|
| 30 | 107% | 102% | 0.3 ± 0.003 | 0.3 ± 0.02 | 100% |
| 40 | 107% | 102% | 0.3 ± 0.003 | 0.3 ± 0.02 | 100% |

In this implementation, by providing the optical modulation layer 103 (HATCN) before the second electrode 104, the optical performance of the organic light-emitting diode 1 can be improved, and the emission layers under the second electrode 104 can be protected, thereby ensuring the injection effect of the electrons generated by the second electrode 104, preventing the dark spots from generating in the display panel 01, and ensuring the display effect of the display panel 01.

Figure 4:
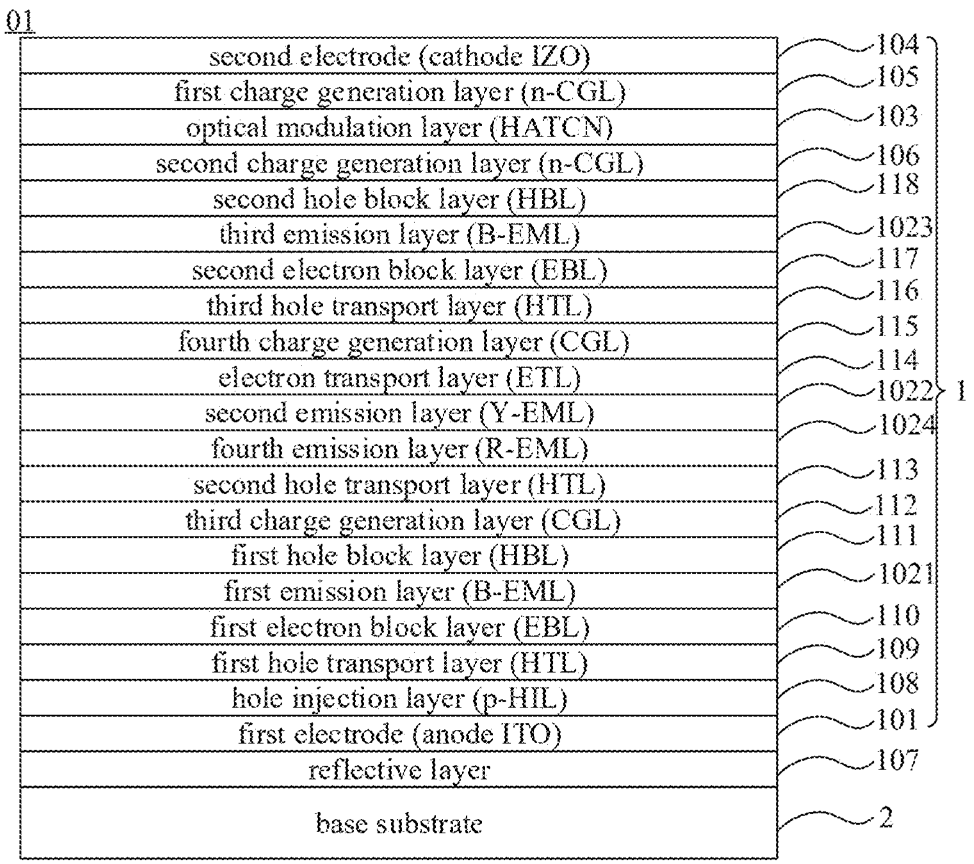
FIG. 4 is a schematic structural diagram of still another display panel according to some embodiments of the present disclosure.

As a third optional implementation, referring to FIG. 4, the organic light-emitting diode 1 further includes a first charge generation layer 105 disposed between the optical modulation layer 103 and the second electrode 104 layer, and a second charge generation layer 106 disposed between the optical modulation layer 103 and the at least two emission layers 102. That is, the first charge generation layer 105 is disposed on the side of the optical modulation layer 103 away from the base substrate 2, and the second charge generation layer 106 is disposed on the side of the optical modulation layer 103 close to the base substrate 2.

The thickness of the first charge generation layer 105 ranges from 10 nm to 110 nm, and the thickness of the second charge generation layer 106 ranges from 30 nm to 70 nm.

In some embodiments, the first charge generation layer 105 includes a first body and a first doping material. The first body is an electron transport layer, and the first doping material includes lithium, or the first doping material includes hydroxyquinolinolato-lithium (LiQ) and ytterbium (Yb). That is, the first charge generation layer 105 is a conventional electron transport layer 114 doped with the first doping material. The first charge generation layer 105 is abbreviated as n-CGL.

Additionally, the material of the second charge generation layer 106 is the same as the material of the first charge generation layer 105. That is, the second charge generation layer 106 also includes the first body and the first doping material. The second charge generation layer 106 is also a conventional electron transport layer doped with the first doping material. The second charge generation layer 106 is also abbreviated as n-CGL.

The LUMO energy level of the first body ranges from −2.75 eV to −2.9 eV, the HOMO level of the first body ranges from −6 eV to 6.2 eV, and the electron mobility ranges from $10^{-3}$ $cm^2/V \cdot S$ to $10^{-2}$ $cm^2/V \cdot S$.

In some embodiments, the material of the optical modulation layer 103 is different from the material of the first charge generation layer 105. The thickness of the optical modulation layer 103 is less than the thickness of the second charge generation layer 106. For example, the thickness of the optical modulation layer 103 ranges from 10 nm to 20 nm.

In this implementation, the material of the optical modulation layer 103 is 12-hexaazatriphenylene (HATCN). The LUMO energy level of the optical modulation layer 103 is 5.7 eV, and the HOMO energy level of the optical modulation layer 103 is 9.5 eV.

By providing the optical modulation layer 103 (HATCN) before the second electrode 104, the optical performance of the organic light-emitting diode 1 can be improved, and the emission layers under the second electrode 104 can be protected, thereby ensuring the injection effect of the electrons generated by the second electrode 104, preventing the dark spots from generating in the display panel 01, and ensuring the display effect of the display panel 01.

Figure 2:
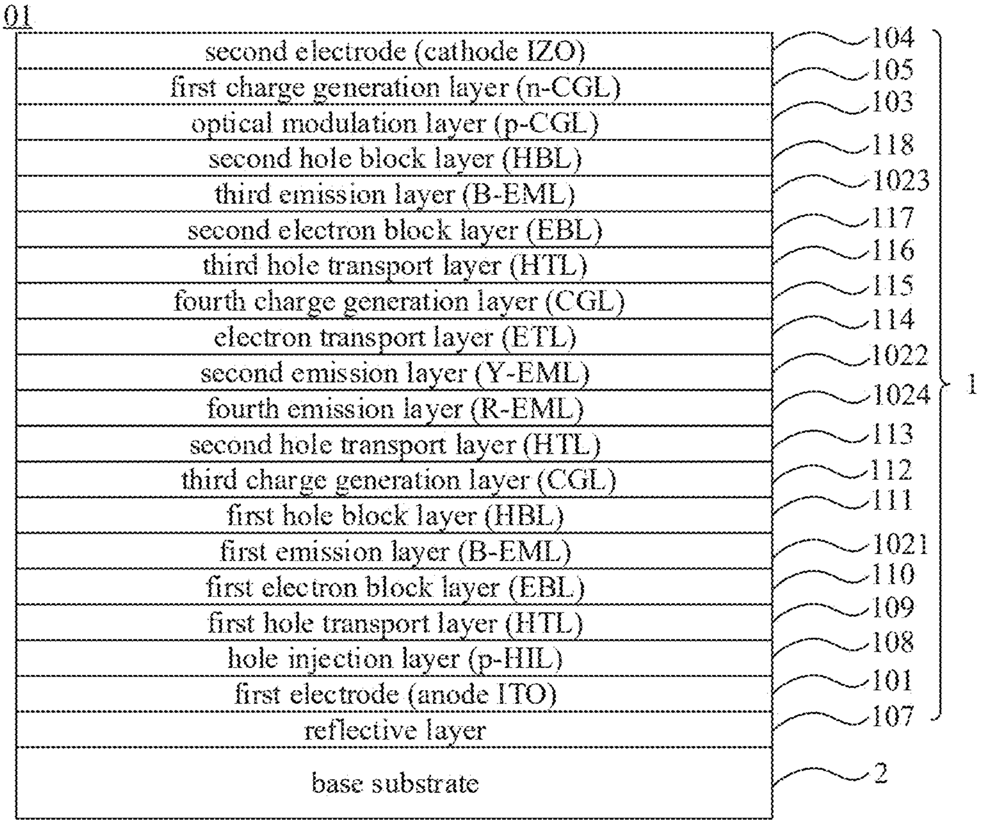
FIG. 2 is a schematic structural diagram of another display panel according to some embodiments of the present disclosure.

As can be seen from FIG. 2 to FIG. 4, the at least two emission layers 102 include a first emission layer 1021, a second emission layer 1022 and a third emission layer 1023 that are sequentially laminated in the direction going away from the base substrate 2. The color of the light emitted from the first emission layer 1021 is the same as the color of the light emitted from the third emission layer 1023, and the color of the light emitted from the second emission layer 1022 is different from the color of the light emitted from the first emission layer 1021.

In some embodiments, the color of the light emitted from the first emission layer 1021 and the color of the light emitted from the third emission layer 1023 are blue (B), and the color of the light emitted from the second emission layer 1022 is yellow (Y). That is, the first emission layer 1021 and the third emission layer 1023 are both blue emission layers (B-EML), and the second emission layer 1022 is a yellow emission layer (Y-EML).

Furthermore, the at least two emission layers 102 further include a fourth emission layer 1024 disposed between the first emission layer 1021 and the second emission layer 1022. The color of the light emitted from the fourth emission layer 1024 is different from the color of the light emitted from the first emission layer 1021, and is different from the color of the light emitted from the second emission layer 1022. In some embodiments, the color of the light emitted from the fourth emission layer 1024 is red (R). That is, the fourth emission layer 1024 is a red emission layer (R-EML).

Referring to FIG. 2 to FIG. 4, the organic light-emitting diode 1 further includes: a reflective layer 107 disposed on the side of the first electrode 101 close to the base substrate 2, and a hole injection layer (HIL) 108, a first hole transport layer (HTL) 109 and a first electron block layer (EBL) 110 which are disposed between the first electrode 101 and the first emission layer 1021 and are sequentially laminated in the direction going away from the base substrate 2. The material of the reflective layer 107 is at least one of aluminum (Al), argentum (Ag), and molybdenum (Mo).

A first thickness solution: the thickness of the first electrode 101 ranges from 5 nm to 20 nm, the thickness of the hole injection layer 108 ranges from 5 nm to 20 nm, the thickness of the first hole transport layer 109 ranges from 100 nm to 130 nm, and the thickness of the first electron block layer 110 ranges from 5 nm to 20 nm.

A second thickness solution: the thickness of the first electrode 101 ranges from 5 nm to 10 nm, the thickness of the hole injection layer 108 ranges from 5 nm to 10 nm, the thickness of the first hole transport layer 109 ranges from 5 nm to 50 nm, and the thickness of the first electron block layer 110 ranges from 5 nm to 10 nm.

In the above three implementations, the thickness of the first electrode 101, the thickness of the hole injection layer 108, the thickness of the first hole transport layer 109 and the thickness of the first electron block layer 110 can be designed. For example, in the above three implementations, the thickness of the first electrode 101, the thickness of the hole injection layer 108, the thickness of the first hole transport layer 109 and the thickness of the first electron block layer 110 can be designed according to the first thickness solution, or can be designed according to the second thickness solution.

Referring to FIG. 2 to FIG. 4, the organic light-emitting diode 1 further includes a first hole block layer (HBL) 111, a third charge generation layer 112 and a second hole transport layer 113 which are disposed between the first emission layer 1021 and the second emission layer 1022 and are sequentially laminated in the direction going away from the base substrate 2.

The thickness of the first hole block layer 111 ranges from 5 nm to 20 nm, the thickness of the third charge generation layer 112 ranges from 5 nm to 20 nm, and the thickness of the second hole transport layer 113 ranges from 5 nm to 20 nm.

Additionally, referring to FIG. 2 to FIG. 4, the organic light-emitting diode 1 further includes an electron transport layer (ETL) 114, a fourth charge generation layer 115, a third hole transport layer 116 and a second electron block layer 117 which are disposed between the second emission layer 1022 and the third emission layer 1023 and are sequentially laminated in the direction going away from the base substrate 2.

The thickness of the electron transport layer 114 ranges from 5 nm to 20 nm, the thickness of the fourth charge generation layer 115 ranges from 10 nm to 30 nm, the thickness of the third hole transport layer 116 ranges from 10 nm to 30 nm, and the thickness of the second electron block layer 117 ranges from 10 nm to 30 nm.

Additionally, in the embodiments of the present disclosure, the thickness of the first emission layer 1021 ranges from 10 nm to 40 nm, the thickness of the second emission layer 1022 ranges from 30 nm to 60 nm, the thickness of the third emission layer 1023 ranges from 10 nm to 30 nm, and the thickness of the second electrode 104 ranges from 80 nm to 120 nm.

In the embodiments of the present disclosure, referring to FIG. 2 to FIG. 4, the organic light-emitting diode 1 further includes a second hole block layer 118 disposed between the third emission layer 1023 and the second electrode 104.

Referring to FIG. 5, in the foregoing first implementation, in the case that the thickness of the first electrode 101, the thickness of the hole injection layer 108, the thickness of the first hole transport layer 109 and the thickness of the first electron block layer 110 are designed according to the first thickness solution, the distance between the side of the third emission layer 1023 close to the base substrate 2 and the first electrode 101 ranges from 210 nm to 480 nm, and the distance between the side of the third emission layer 1023 close to the base substrate 2 and the second electrode 104 ranges from 65 nm to 250 nm.

Referring to FIG. 6, in the foregoing first implementation, in the case that the thickness of the first electrode 101, the thickness of the hole injection layer 108, the thickness of the first hole transport layer 109 and the thickness of the first electron block layer 110 are designed according to the second thickness solution, the distance between the side of the third emission layer 1023 close to the base substrate 2 and the reflective layer 107 ranges from 115 nm to 370 nm, and the distance between the side of the third emission layer 1023 close to the base substrate 2 and the second electrode 104 ranges from 65 nm to 250 nm.

Referring to FIG. 7, in the foregoing second implementation, in the case that the thickness of the first electrode 101, the thickness of the hole injection layer 108, the thickness of the first hole transport layer 109 and the thickness of the first electron block layer 110 are designed according to the first thickness solution, the distance between the side of the third emission layer 1023 close to the base substrate 2 and the reflective layer 107 ranges from 210 nm to 480 nm, and the distance between the side of the third emission layer 1023 close to the base substrate 2 and the second electrode 104 ranges from 115 nm to 250 nm.

Referring to FIG. 8, in the foregoing second implementation, in the case that the thickness of the first electrode 101, the thickness of the hole injection layer 108, the thickness of the first hole transport layer 109 and the thickness of the first electron block layer 110 are designed according to the second thickness solution, the distance between the side of the third emission layer 1023 close to the base substrate 2 and the reflective layer 107 ranges from 115 nm to 370 nm, and the distance between the side of the third emission layer 1023 close to the base substrate 2 and the second electrode 104 ranges from 115 nm to 250 nm.

Referring to FIG. 9, in the foregoing third implementation, in the case that the thickness of the first electrode 101, the thickness of the hole injection layer 108, the thickness of the first hole transport layer 109 and the thickness of the first electron block layer 110 are designed according to the first thickness solution, the distance between the side of the third emission layer 1023 close to the base substrate 2 and the reflective layer 107 ranges from 210 nm to 480 nm, and the distance between the side of the third emission layer 1023 close to the base substrate 2 and the second electrode 104 ranges from 65 nm to 250 nm.

Referring to FIG. 10, in the foregoing third implementation, in the case that the thickness of the first electrode 101, the thickness of the hole injection layer 108, the thickness of the first hole transport layer 109 and the thickness of the first electron block layer 110 are designed according to the second thickness solution, the distance between the side of the third emission layer 1023 close to the base substrate 2 and the reflective layer 107 ranges from 115 nm to 370 nm, and the distance between the side of the third emission layer 1023 close to the base substrate 2 and the second electrode 104 ranges from 65 nm to 250 nm.

In the embodiments of the present disclosure, the third charge generation layer 112 and the fourth charge generation layer 115 each include a P-type charge generation layer (p-CGL) and an N-type charge generation layer (n-CGL). The p-CGL is a conventional hole transport layer doped with HATCN, or a conventional hole transport layer doped with molybdenum oxide. The n-CGL is a conventional electron transport layer doped with lithium, or a conventional electron transport layer doped with hydroxyquinolinolato-lithium (LiQ) and ytterbium (Yb).

Additionally, the hole injection layer HIL in the embodiments of the present disclosure is a P-type hole injection layer, denoted as P-HIL. The P-type hole injection layer is a conventional hole injection layer doped with a material with a relatively low LUMO energy level. For example, the P-type hole injection layer is a conventional hole injection layer doped with HATCN or molybdenum oxide. The doping ratio ranges from 1.5% to 15%.

In summary, the embodiments of the present disclosure provide an organic light-emitting diode. The organic light-emitting diode includes a first electrode, at least two emission layers, an optical modulation layer, and a second electrode. The thickness of the optical modulation layer has a relatively bigger range. Therefore, in the case that the thicknesses of other film layers between the first electrode and the second electrode vary, an optical modulation layer having a different thickness can be provided to adjust the microcavity length of the organic light-emitting diode, thereby ensuring the optical performance of the organic light-emitting diode and the display effect of the display panel.

The embodiments of the present disclosure further provide a display panel. As shown in FIG. 1 to FIG. 4, the display panel includes a base substrate 2, and a plurality of organic light-emitting diodes 1 as described in the foregoing embodiments, and the plurality of organic light-emitting diodes 1 are disposed on a side of the base substrate 2. FIG. 1 to FIG. 4 illustratively show only one organic light-emitting diode.

Since the display panel has substantially the same technical effects as the organic light-emitting diode described in the foregoing embodiments, the technical effects of the display panel are not repeated here for the sake of brevity.

Figure 11:
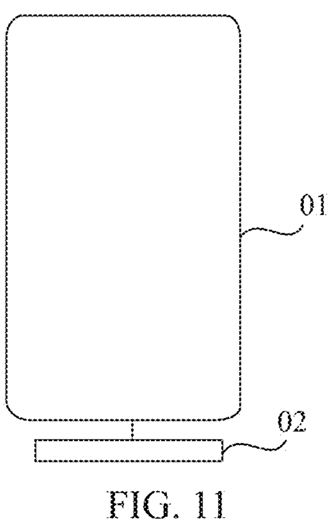
FIG. 11 is a schematic structural diagram of a display device according to some embodiments of the present disclosure.

FIG. 11 is a schematic structural diagram of a display device according to some embodiments of the present disclosure. Referring to FIG. 11, the display device includes a power supply assembly 02, and the display panel 01 as described in the foregoing embodiments. The power supply assembly 02 is configured to supply power to the display panel 01.

In some embodiments, the display device is an OLED display device, and the display device may be any display device, including but not limited to any product or component having a display function such as a mobile phone, a tablet computer, a television, a display, a notebook computer, a digital photo frame, a navigator, and an electronic book.

Since the display device has substantially the same technical effects as the organic light-emitting diode described in the foregoing embodiments, the technical effects of the display device are not repeated here for the sake of brevity.

It is to be understood that although the terms of first, second and the like are used herein to describe various elements, components, regions, layers, and/or portions, these elements, components, regions, layers, and/or portions should not be limited by these terms. These terms are merely used to distinguish one element, component, region, layer, or portion from another region, layer, or portion. Accordingly, the first element, component, region, layer, or portion discussed above may be referred to as a second element, component, region, layer, or portion without departing from the teachings of the present disclosure.

Spatial relative terms such as "under," "on," "left," "right" may be used herein to describe the relationship between one element or feature and another element(s) or feature (s) as illustrated in the figures. It is to be understood that these spatial relative terms are intended to encompass different orientations of the devices in use or operation in addition to the orientations depicted in the figures. For example, if a device in the figure is turned upside down, the elements described as being "under another element or feature" will be oriented "on" the element or feature. Thus, the exemplary term "under" encompasses both orientations of "on" and "under". The devices may be oriented in other ways (rotated 90 degrees or otherwise) and the spatial relative descriptors used herein are interpreted accordingly. Furthermore, it is to be understood that when a layer is referred to as being "between two layers", it may be the only layer between the two layers, or one or more intermediate layers may also exist.

The terms used herein are merely for the purpose of describing particular embodiments and are not intended to limit the present disclosure. As used herein, the singular forms "/an," "one," and "the" are intended to encompass the plural forms, unless the context clearly specifies otherwise.

It will be further understood that the terms "comprising" and/or "including" used in this specification indicate the presence of the stated features, integers, steps, operations, elements, and/or components, without excluding the presence or addition of one or more of other features, integers, steps, operations, elements, components, and/or groups thereof. As used herein, the term "and/or" includes any one of the associated listed items or any and all combinations of more of the associated listed items. The specific features, structures, materials or characteristics described in this specification may be combined in any one or more embodiments or examples in a suitable manner. In addition, different embodiments or examples described and features of different embodiments or examples in this specification may be combined, without contradicting each other.

Unless otherwise defined, all terms (including technical and scientific terms) used herein have the same meaning as commonly understood by one of ordinary skill in the art to which this disclosure pertains. It will be further understood that the terms such as those defined in commonly used dictionaries should be interpreted as having the meanings consistent with their meanings in the relevant art and/or context of this specification and shall not be interpreted in an idealized or overly formal sense unless expressly so defined herein.

The above descriptions are merely optional embodiments of the present disclosure, and are not intended to limit the present disclosure. Any modifications, equivalent substitutions, improvements and the like made within the spirit and principles of the present disclosure shall be included within the protection scope of the present disclosure.

What is claimed is:

1. An organic light-emitting diode, wherein the organic light-emitting diode comprises: a first electrode, at least two emission layers, an optical modulation layer and a second electrode which are sequentially laminated on a base substrate; wherein a color of a mixture of light emitted from the at least two emission layers is white; and a thickness of the optical modulation layer ranges from 5 nm to 100 nm.

2. The organic light-emitting diode according to claim 1, wherein the organic light-emitting diode further comprises: a first charge generation layer disposed between the optical modulation layer and the second electrode; wherein a thickness of the first charge generation layer is greater than the thickness of the optical modulation layer.

3. The organic light-emitting diode according to claim 2, wherein a ratio of the thickness of the first charge generation layer to the thickness of the optical modulation layer is 8:1.

4. The organic light-emitting diode according to claim 3, wherein a total thickness of the first charge generation layer and the optical modulation layer ranges from 50 nm to 200 nm.

5. The organic light-emitting diode according to claim 2, wherein the first charge generation layer comprises a first body and a first doping material, wherein the first body is an electron transport layer, and the first doping material comprises lithium, or the first doping material comprises hydroxyquinolinolato-lithium and ytterbium; and the optical modulation layer comprises a second body and a second doping material, wherein the second body is a hole transport layer, and the second doping material comprises 12-hexaazatriphenylene, or the second doping material comprises molybdenum oxide.

6. The organic light-emitting diode according to claim 5, wherein a doping ratio of the first doping material in the first body ranges from 1.5% to 10%; and a doping ratio of the second doping material in the second body ranges from 5% to 20%.

7. The organic light-emitting diode according to claim 1, wherein the organic light-emitting diode further comprises: a first charge generation layer disposed between the at least two emission layers and the optical modulation layer; wherein a thickness of the first charge generation layer ranges from 80 nm to 100 nm.

8. The organic light-emitting diode according to claim 7, wherein a material of the optical modulation layer is 12-hexaazatriphenylene.

9. The organic light-emitting diode according to claim 1, wherein the organic light-emitting diode further comprises: a first charge generation layer disposed between the optical modulation layer and the second electrode, and a second charge generation layer disposed between the optical modulation layer and the at least two emission layers; wherein a thickness of the first charge generation layer ranges from 10 nm to 110 nm, and a thickness of the second charge generation layer ranges from 30 nm to 70 nm.

10. The organic light-emitting diode according to claim 9, wherein the first charge generation layer comprises a first body and a first doping material, wherein the first body is an electron transport layer, and the first doping material comprises lithium, or the first doping material comprises hydroxyquinolinolato-lithium and ytterbium; and a material of the second charge generation layer is the same as a material of the first charge generation layer.

11. The organic light-emitting diode according to claim 10, wherein a material of the optical modulation layer is different from the material of the first charge generation layer, and the thickness of the optical modulation layer is less than the thickness of the second charge generation layer.

12. The organic light-emitting diode according to claim 11, wherein the material of the optical modulation layer is 12-hexaazatriphenylene.

13. The organic light-emitting diode according to claim 11, wherein the thickness of the optical modulation layer ranges from 10 nm to 20 nm.

14. The organic light-emitting diode according to claim 1, wherein the at least two emission layers comprise: a first emission layer, a second emission layer and a third emission layer which are sequentially laminated in a direction going away from the base substrate; wherein a color of light emitted from the first emission layer is the same as a color of light emitted from the third emission layer, and a color of light emitted from the second emission layer is different from the color of the light emitted from the first emission layer.

15. The organic light-emitting diode according to claim 14, wherein the organic light-emitting diode further comprises: a reflective layer disposed on a side of the first electrode close to the base substrate, and a hole injection layer, a first hole transport layer and a first electron block layer which are disposed between the first electrode and the first emission layer and are sequentially laminated in the direction going away from the base substrate; wherein a thickness of the reflective layer ranges from 50 nm to 150 nm, a thickness of the first electrode ranges from 5 nm to 20 nm, a thickness of the hole injection layer ranges from 5 nm to 20 nm, a thickness of the first hole transport layer ranges from 100 nm to 130 nm, and a thickness of the first electron block layer ranges from 5 nm to 20 nm; or a thickness of the reflective layer ranges from 50 nm to 150 nm, a thickness of the first electrode ranges from 5 nm to 10 nm, a thickness of the hole injection layer ranges from 5 nm to 10 nm, a thickness of the first hole transport layer ranges from 5 nm to 50 nm, and a thickness of the first electron block layer ranges from 5 nm to 10 nm.

16. The organic light-emitting diode according to claim 14, wherein the organic light-emitting diode further comprises: a first hole block layer, a third charge generation layer and a second hole transport layer which are disposed between the first emission layer and the second emission layer and are sequentially laminated in the direction going away from the base substrate, wherein a thickness of the first hole block layer ranges from 5 nm to 20 nm, a thickness of the third charge generation layer ranges from 5 nm to 20 nm, and a thickness of the second hole transport layer ranges from 5 nm to 20 nm;

the organic light-emitting diode further comprises: an electron transport layer, a fourth charge generation layer, a third hole transport layer and a second electron block layer which are disposed between the second emission layer and the third emission layer and are sequentially laminated in the direction going away from the base substrate, wherein a thickness of the electron transport layer ranges from 5 nm to 20 nm, a thickness of the fourth charge generation layer ranges from 10 nm to 30 nm, a thickness of the third hole transport layer ranges from 10 nm to 30 nm, and a thickness of the second electron block layer ranges from 10 nm to 30 nm.

17. The organic light-emitting diode according to claim 14, wherein the at least two emission layers further comprise: a fourth emission layer disposed between the first emission layer and the second emission layer; wherein a color of light emitted from the fourth emission layer is different from the color of the light emitted from the first emission layer, and is different from the color of the light emitted from the second emission layer.

18. The organic light-emitting diode according to claim 14, wherein a thickness of the first emission layer ranges from 10 nm to 40 nm, a thickness of the second emission layer ranges from 30 nm to 60 nm, a thickness of the third emission layer ranges from 10 nm to 30 nm, and a thickness of the second electrode ranges from 80 nm to 120 nm.

19. A display panel, wherein the display panel comprises: a base substrate, and a plurality of organic light-emitting diodes; wherein the plurality of organic light-emitting diodes are disposed on a side of the base substrate; and the organic light-emitting diode comprises: a first electrode, at least two emission layers, an optical modulation layer and a second electrode which are sequentially laminated on a base substrate; wherein a color of a mixture of light emitted from the at least two emission layers is white; and a thickness of the optical modulation layer ranges from 5 nm to 100 nm.

20. A display device, comprising: a power supply assembly, and a display panel; wherein the power supply assembly is configured to supply power to the display panel; and the display panel comprises: a base substrate, and a plurality of organic light-emitting diodes; wherein the plurality of organic light-emitting diodes are disposed on a side of the base substrate; and the organic light-emitting diode comprises: a first electrode, at least two emission layers, an optical modulation layer and a second electrode which are sequentially laminated on a base substrate; wherein a color of a mixture of light emitted from the at least two emission layers is white; and a thickness of the optical modulation layer ranges from 5 nm to 100 nm.

* * * * *